(12) United States Patent
Wang et al.

(10) Patent No.: US 11,313,908 B2
(45) Date of Patent: Apr. 26, 2022

(54) DETECTION CIRCUIT, METHOD, AND APPARATUS

(71) Applicant: Huawei Technologies Co., Ltd., Shenzhen (CN)

(72) Inventors: Wencheng Wang, Shenzhen (CN); Yang Lv, Dongguan (CN); Ting Gao, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 295 days.

(21) Appl. No.: 16/576,368

(22) Filed: Sep. 19, 2019

(65) Prior Publication Data

US 2020/0011929 A1 Jan. 9, 2020

Related U.S. Application Data

(63) Continuation of application No. PCT/CN2017/115042, filed on Dec. 7, 2017.

(30) Foreign Application Priority Data

Mar. 20, 2017 (CN) .......................... 201710167220.7

(51) Int. Cl.
*G01R 31/327* (2006.01)
*B60L 3/00* (2019.01)
*G01R 19/10* (2006.01)

(52) U.S. Cl.
CPC ........ *G01R 31/3278* (2013.01); *B60L 3/0046* (2013.01); *G01R 19/10* (2013.01)

(58) Field of Classification Search
CPC ............ G01R 31/3278; G01R 31/3277; G01R 31/006; G01R 19/10; Y02T 90/14;
(Continued)

(56) References Cited

U.S. PATENT DOCUMENTS

2006/0021098 A1 1/2006 Tezuka
2011/0122536 A1* 5/2011 Watanabe ............. B60L 3/0069
361/46
(Continued)

FOREIGN PATENT DOCUMENTS

CN 103675591 A 3/2014
CN 103995211 A 8/2014
(Continued)

OTHER PUBLICATIONS

Machine Translation and Abstract of Chinese Publication No. CN103675591, Mar. 26, 2014, 8 pages.
(Continued)

*Primary Examiner* — Huy Q Phan
*Assistant Examiner* — Dustin R Dickinson
(74) *Attorney, Agent, or Firm* — Conley Rose, P.C.

(57) ABSTRACT

A detection circuit includes a switch conversion unit and a collection control unit. The switch conversion unit is configured to: enable a first end of the switch conversion unit to connect to a third end of the switch conversion unit within first duration, and enable a second end of the switch conversion unit to connect to the third end of the switch conversion unit within second duration. The collection control unit is configured to: collect a voltage (V1) between a first end of a relay and a second end of a battery pack within the first duration, collect a voltage (V2) between a second end of the relay and the second end of the battery pack within the second duration, and determine, based on V1 and V2, whether the relay is faulty.

20 Claims, 13 Drawing Sheets

(58) Field of Classification Search
CPC . B60L 3/04; B60L 3/0046; B60L 3/00; H01H 47/002
See application file for complete search history.

(56) References Cited

U.S. PATENT DOCUMENTS

| | | | | |
|---|---|---|---|---|
| 2013/0257440 | A1* | 10/2013 | Takahashi | H02J 7/0034 324/418 |
| 2015/0241500 | A1* | 8/2015 | Mochizuki | H02H 3/16 324/418 |
| 2015/0346282 | A1* | 12/2015 | Jeon | G01R 31/3278 324/418 |
| 2016/0084908 | A1 | 3/2016 | Shiraishi et al. | |

FOREIGN PATENT DOCUMENTS

| | | |
|---|---|---|
| CN | 104391241 A | 3/2015 |
| CN | 204556787 U | 8/2015 |
| CN | 105425141 A | 3/2016 |
| CN | 106427614 A | 2/2017 |
| KR | 101504274 B1 | 3/2015 |

OTHER PUBLICATIONS

Machine Translation and Abstract of Chinese Publication No. CN103995211, Aug. 20, 2014, 20 pages.
Machine Translation and Abstract of Chinese Publication No. CN104391241, Mar. 4, 2015, 11 pages.
Machine Translation and Abstract of Chinese Publication No. CN106427614, Feb. 22, 2017, 9 pages.
Machine Translation and Abstract of Korean Publication No. KR101504274, Mar. 19, 2015, 23 pages.
Foreign Communication From A Counterpart Application, PCT Application No. PCT/CN2017/115042, English Translation of International Search Report dated Mar. 6, 2018, 2 pages.
Foreign Communication From A Counterpart Application, PCT Application No. PCT/CN2017/115042, English Translation of Written Opinion dated Mar. 6, 2018, 5 pages.

* cited by examiner

DETECTION CIRCUIT, METHOD, AND APPARATUS

CROSS-REFERENCE TO RELATED APPLICATIONS

This application is a continuation of International Application No. PCT/CN2017/115042 filed on Dec. 7, 2017, which claims priority to Chinese Patent Application 201710167220.7, filed on Mar. 20, 2017. The disclosures of the aforementioned applications are hereby incorporated by reference in their entireties.

TECHNICAL FIELD

This application relates to the field of electric vehicles, and in particular, to a detection circuit, method, and apparatus.

BACKGROUND

A high-voltage power battery system plays a key role in ensuring vehicle safety. A battery management system may include a high-voltage relay. The high-voltage relay may be used as a safety switch, and is disconnected when a voltage is greater than a preset threshold to ensure safety of a circuit and the battery management system. Because the high-voltage relay is prone to be faulty, the battery management system needs to regularly detect the high-voltage relay, so that when the high-voltage relay is faulty, the battery management system reports the fault to the high-voltage power battery system in time. Then, the high-voltage power battery system handles the faulty high-voltage relay in time to improve safety and reliability of the high-voltage power battery system.

The high-voltage relay may include a negative output relay, a pre-charge relay, a positive output relay, or the like. Currently, a detection circuit includes a battery pack, a positive output relay, a negative output relay, a pre-charge relay, a pre-charge resistor, and a collection control unit. A connection relationship between these components is shown in FIG. 1. Based on the detection circuit, a detection method may include the following steps. First, the collection control unit controls the negative output relay and the pre-charge relay to be closed, and this process may be referred to as a power-on process. Then, the collection control unit collects a load voltage. If the load voltage gradually rises to a total voltage of the battery pack as expected, it indicates that the negative output relay and the pre-charge relay are normal, and then it may be detected whether the positive output relay is faulty. If the load voltage is 0, the detection is stopped.

In the foregoing method, detecting whether the negative output relay is faulty needs to depend on the pre-charge relay, and only when the negative output relay is normal, it can be detected whether the positive output relay is faulty. Consequently, safety and reliability of the high-voltage power battery system cannot be effectively improved.

SUMMARY

This application provides a detection circuit, method, and apparatus to improve safety and reliability of a high-voltage power battery system.

According to a first aspect, this application provides a detection circuit, applied to a battery management system. The battery management system may include a battery pack, a relay, and a load. A first end of the battery pack is connected to a first end of the relay, a second end of the relay is connected to one end of the load, and the other end of the load is connected to a second end of the battery pack. The detection circuit may include a switch conversion unit and a collection control unit. The switch conversion unit includes a first end, a second end, and a third end, the first end of the switch conversion unit is connected to the first end of the relay, and the second end of the switch conversion unit is connected to the second end of the relay. The collection control unit includes a first end and a second end, the first end of the collection control unit is connected to the third end of the switch conversion unit, and the second end of the collection control unit is connected to the second end of the battery pack. The switch conversion unit may be configured to enable the first end of the switch conversion unit to connect to the third end of the switch conversion unit within first duration, and enable the second end of the switch conversion unit to connect to the third end of the switch conversion unit within second duration. The collection control unit may be configured to collect a voltage V1 between the first end of the relay and the second end of the battery pack within the first duration, collect a voltage V2 between the second end of the relay and the second end of the battery pack within the second duration, and determine, based on V1 and V2, whether the relay is faulty. According to the detection circuit provided in this application, it can be independently detected whether each relay is faulty to improve stability of a high-voltage power battery system.

In a possible design, a first switch is disposed between the first end of the switch conversion unit and the third end of the switch conversion unit, and a second switch is disposed between the second end of the switch conversion unit and the third end of the switch conversion unit. The first switch is closed within the first duration and is opened within the second duration. In this way, the collection control unit may collect the voltage between the first end of the relay and the second end of the battery pack within the first duration. The second switch is closed within the second duration and is opened within the first duration. In this way, the collection control unit may collect the voltage between the second end of the relay and the second end of the battery pack within the second duration. In this possible design, a specific implementation of the switch conversion unit is provided.

In a possible design, the switch conversion unit includes a third switch. The third switch includes a first end, a second end, and a third end, and the third end of the third switch is the third end of the switch conversion unit. The third switch is configured to conduct the first end of the third switch and the third end of the third switch within the first duration, so that the first end of the third switch serves as the first end of the switch conversion unit. The third switch is configured to conduct the second end of the third switch and the third end of the third switch within the second duration, so that the third end of the third switch servers as the third end of the switch conversion unit. In this possible design, another specific implementation of the switch conversion unit is provided.

In a possible design, a fourth switch may be disposed between the second end of the battery pack and the second end of the collection control unit. In this way, conduction and disconnection of a circuit between the battery pack and the collection control unit can be controlled.

In a possible design, the collection control unit may be configured to determine a state of the relay based on an absolute value of a difference between V1 and V2, and if determining that the state of the relay is different from a preset state, determine that the relay is faulty, where the state of the relay includes a closed state or an open state, and the preset state includes a closed state or an open state.

In a possible design, the relay may include any one of a positive output relay, a pre-charge relay, a negative output relay, and the like.

According to a second aspect, a detection apparatus is provided. The apparatus may include any detection circuit provided in the first aspect.

According to a third aspect, a detection method is provided. The method may be applied to any detection circuit provided in the first aspect. The detection circuit is applied to a battery management system, and the battery management system includes a battery pack, a relay, and a load. A first end of the battery pack is connected to a first end of the relay, a second end of the relay is connected to one end of the load, and the other end of the load is connected to a second end of the battery pack. The method may include collecting a voltage V1 between the first end of the relay and the second end of the battery pack within first duration, collecting a voltage V2 between the second end of the relay and the second end of the battery pack within second duration, and determining, based on V1 and V2, whether the relay is faulty. According to the detection method provided in this application, it can be independently detected whether each relay is faulty to improve stability of a high-voltage power battery system.

In a possible design, the determining, based on V1 and V2, whether the relay is faulty may include determining a state of the relay based on an absolute value of a difference between V1 and V2, where the state of the relay includes a closed state or an open state, and if determining that the state of the relay is different from a preset state, determining that the relay is faulty, where the preset state includes a closed state or an open state.

For related explanations and beneficial effects of the technical solution provided in the second aspect or the third aspect, refer to the first aspect. Details are not described herein again.

DESCRIPTION OF EMBODIMENTS

If a relay in a battery management system is faulty, normal operation of the battery management system is affected. This is not conducive to safety of a high-voltage power battery system. To improve safety of the high-voltage power battery management system, this application provides a detection circuit. A basic principle of the detection circuit is as follows. The detection circuit may include a switch conversion unit. The switch conversion unit may enable a collection control unit to collect a voltage V1 between a first end of a relay and a second end of a battery pack within first duration, and enable the collection control unit to collect a voltage V2 between a second end of the relay and the second end of the battery pack within second duration, so that the collection control unit can determine, based on V1 and V2, whether the relay is faulty. In this way, it can be independently detected whether each relay is faulty.

In this specification, "first", "second", and the like are intended to distinguish between different objects more clearly, and are not intended to constitute any other limitation. In this specification, "a plurality of" means two or more.

Figure 1:
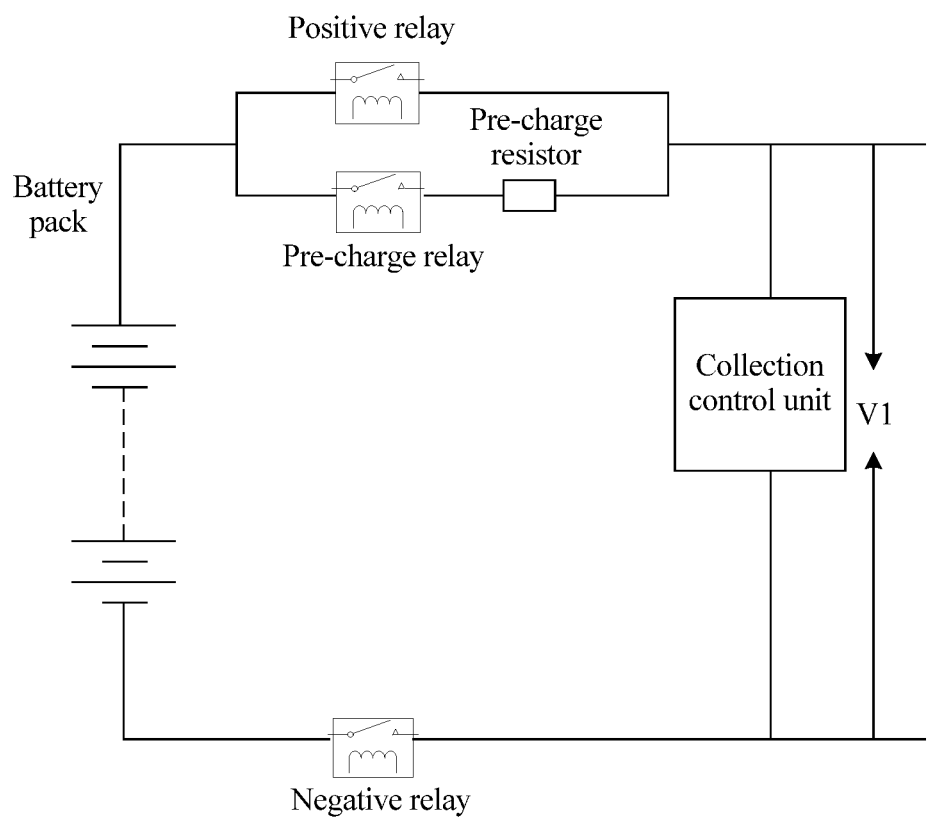
FIG. 1 is a schematic diagram of a detection circuit.
Figure 2:
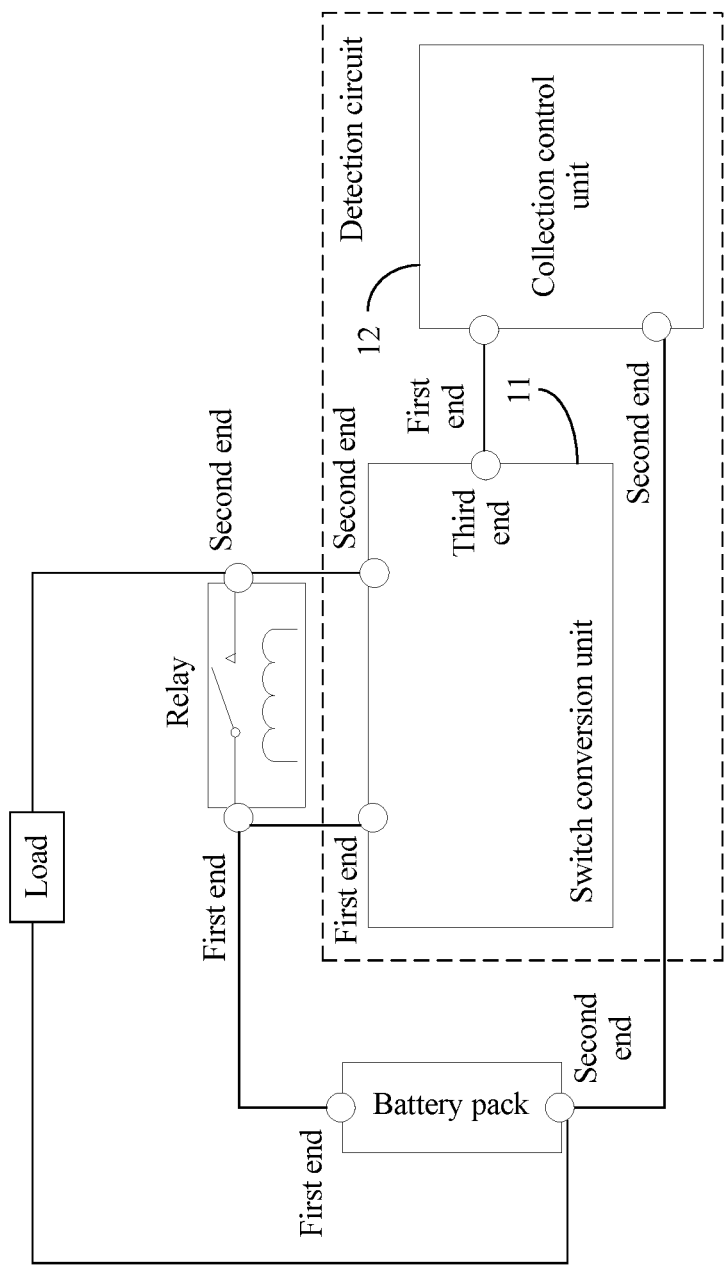
FIG. 2 is a schematic diagram of a detection circuit according to this application.

FIG. 2 shows a detection circuit according to this application. The detection circuit is applied to a battery management system, and the battery management system may include a battery pack, a relay, and a load. A first end of the battery pack is connected to a first end of the relay, a second end of the relay is connected to one end of the load, and the other end of the load is connected to a second end of the battery pack. The detection circuit includes a switch conversion unit 11 and a collection control unit 12. A first end of the switch conversion unit 11 is connected to the first end of the relay, a second end of the switch conversion unit 11 is connected to the second end of the relay, a third end of the switch conversion unit 11 is connected to a first end of the collection control unit 12, and a second end of the collection control unit 12 is connected to the second end of the battery pack.

It should be noted that the switch conversion unit 11 may include but is not limited to a switch, a semiconductor component, and the like. The collection control unit 12 may include an electronic circuit unit, and the electronic circuit unit may include a voltage collection circuit equivalent to a voltmeter, a controller integrated into the circuit, and the like. In logical division, the collection control unit 12 may include a collection unit and a control unit. The collection unit may include a voltage collection unit equivalent to a voltmeter, and is configured to collect a voltage. The control unit may include a controller or a processor, and is configured to determine whether the relay is faulty. Optionally, the relay may include but is not limited to a positive output relay, a pre-charge relay, a negative output relay, and the like.

In FIG. 2, if the first end of the battery pack is a positive electrode, the relay may be a positive output relay, a pre-charge relay, or the like. If the first end of the battery pack is a negative electrode, the relay may be a negative output relay or the like.

The switch conversion unit 11 may be configured to enable the first end of the switch conversion unit 11 to connect to the third end of the switch conversion unit 11 within first duration, and enable the second end of the switch conversion unit 11 to connect to the third end of the switch conversion unit within second duration. The first duration and the second duration each may be any duration. This is not limited in this embodiment of the present disclosure. In addition, optionally, a time period of the first duration and a time period of the second duration do not overlap.

The collection control unit 12 may be configured to collect a voltage V1 between the first end of the relay and the second end of the battery pack within the first duration, collect a voltage V2 between the second end of the relay and the second end of the battery pack within the second duration, and determine, based on V1 and V2, whether the relay is faulty.

That the collection control unit 12 determines, based on V1 and V2, whether the relay is faulty may include the following steps. First, the collection control unit 12 determines a state of the relay based on an absolute value of a difference between V1 and V2. In an embodiment, the collection control unit 12 may calculate the absolute value of the difference between V1 and V2. If determining that the absolute value of the difference between V1 and V2 is less than or equal to a preset threshold, the collection control unit 12 determines that the state of the relay is a closed state. If determining that the absolute value of the difference between V1 and V2 is greater than the preset threshold, the collection control unit 12 determines that the state of the relay is an open state. Then, if determining that the state of the relay is different from a preset state, the collection control unit 12 determines that the relay is faulty. The state of the relay includes one of a closed state and an open state. The preset state includes one of a closed state and an open state.

When the relay is closed, V1 and V2 each are equivalent to a voltage of the battery pack, and values of V1 and V2 are approximately equal. Therefore, if the absolute value of the difference between V1 and V2 is less than or equal to the preset threshold, the state of the relay is the closed state. The preset threshold may be set by the battery management system.

During specific implementation, the preset state may be a state indicated by a control command sent by the collection control unit 12 to the switch conversion unit 11, or may be a state indicated by a control command sent by an independent processor to the switch conversion unit 11. The independent processor may be disposed in the battery management system, and the independent processor and the detection circuit are separately disposed. Alternatively, the independent processor may be disposed outside the battery management system. If the control command is a closing command, the preset state is the closed state. If the control command is an opening command, the preset state is the open state.

In the technical solution provided in this application, the first end of the switch conversion unit is connected to the third end of the switch conversion unit within the first duration, and the voltage V1 between the first end of the relay and the second end of the battery pack is collected. The second end of the switch conversion unit is connected to the third end of the switch conversion unit within the second duration, and the voltage V2 between the second end of the relay and the second end of the battery pack is collected. It is determined, based on V1 and V2, whether the relay is faulty. It is determined, based on a collected load voltage, whether the negative output relay and the pre-charge relay are normal, and when both the negative output relay and the pre-charge relay are normal, it is detected whether a positive output relay is faulty, in the technical solution provided in this application, it can be independently detected whether the relay is faulty to improve safety and reliability of a high-voltage power battery system.

In addition, according to the detection circuit provided in this application, it may be detected, in a power-on process, whether the relay is faulty, or it may be detected, after a power-on process is completed, whether the relay is faulty. After the power-on process is completed, the pre-charge relay is short-circuited. Therefore, after the power-on process is completed, there is no need to detect whether the pre-charge relay is faulty. The power-on process is a process in which the negative output relay and the pre-charge relay are closed, to charge a load capacitor.

The switch conversion unit 11 provided in this application is described below in a manner 1 and a manner 2. Certainly, this is not limited thereto during specific implementation.

Figure 3:
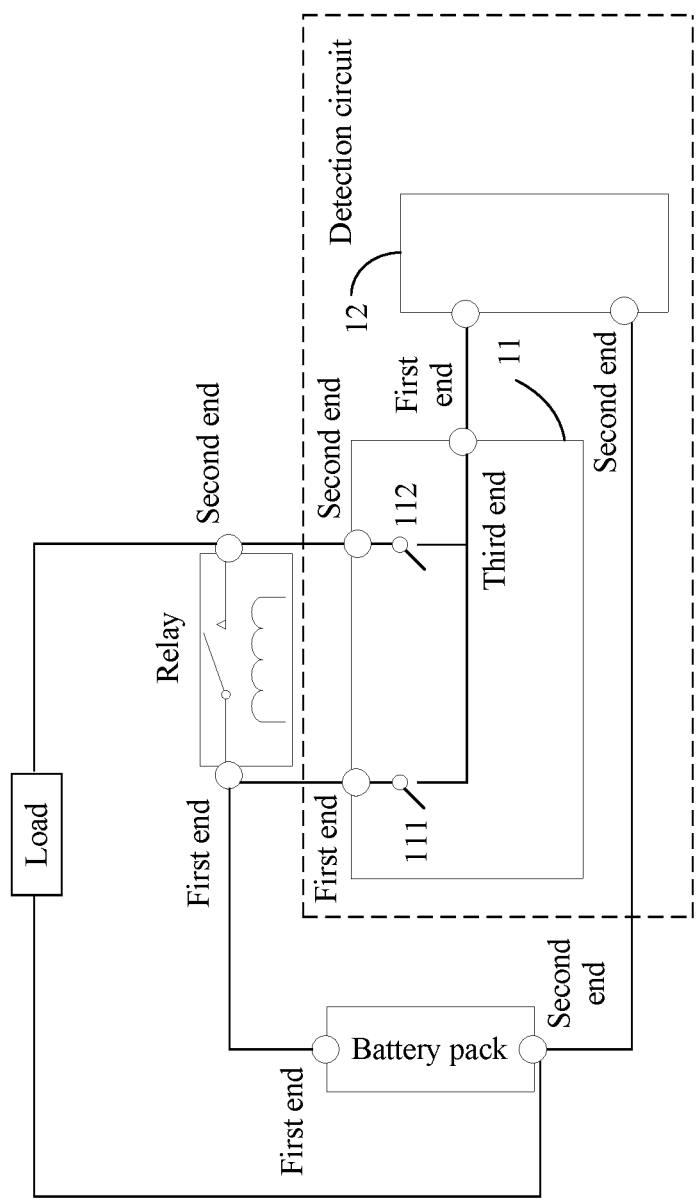
FIG. 3 is a schematic diagram of another detection circuit according to this application.

In the manner 1, the switch conversion unit 11 includes a first switch 111 and a second switch 112. As shown in FIG. 3, the first switch 111 is disposed between the first end of the switch conversion unit 11 and the third end of the switch conversion unit 11, and the second switch 112 is disposed between the second end of the switch conversion unit 11 and the third end of the switch conversion unit 11. FIG. 3 is drawn based on FIG. 2.

The first switch 111 and the second switch 112 each may be a controllable switch, for example, may include but are not limited to a single-pole single-throw switch, a semiconductor switch, and an optical coupling switch. The first switch 111 is closed within the first duration, to enable the first end of the switch conversion unit 11 to connect to the third end of the switch conversion unit 11 within the first duration, so that the collection control unit 12 collects the voltage V1. The second switch 112 is closed within the second duration, to enable the second end of the switch conversion unit 11 to connect to the third end of the switch conversion unit 11 within the second duration, so that the collection control unit 12 collects the voltage V2. Usually, the first switch 111 is opened within the second duration, and the second switch 112 is opened within the first duration.

Figure 4:
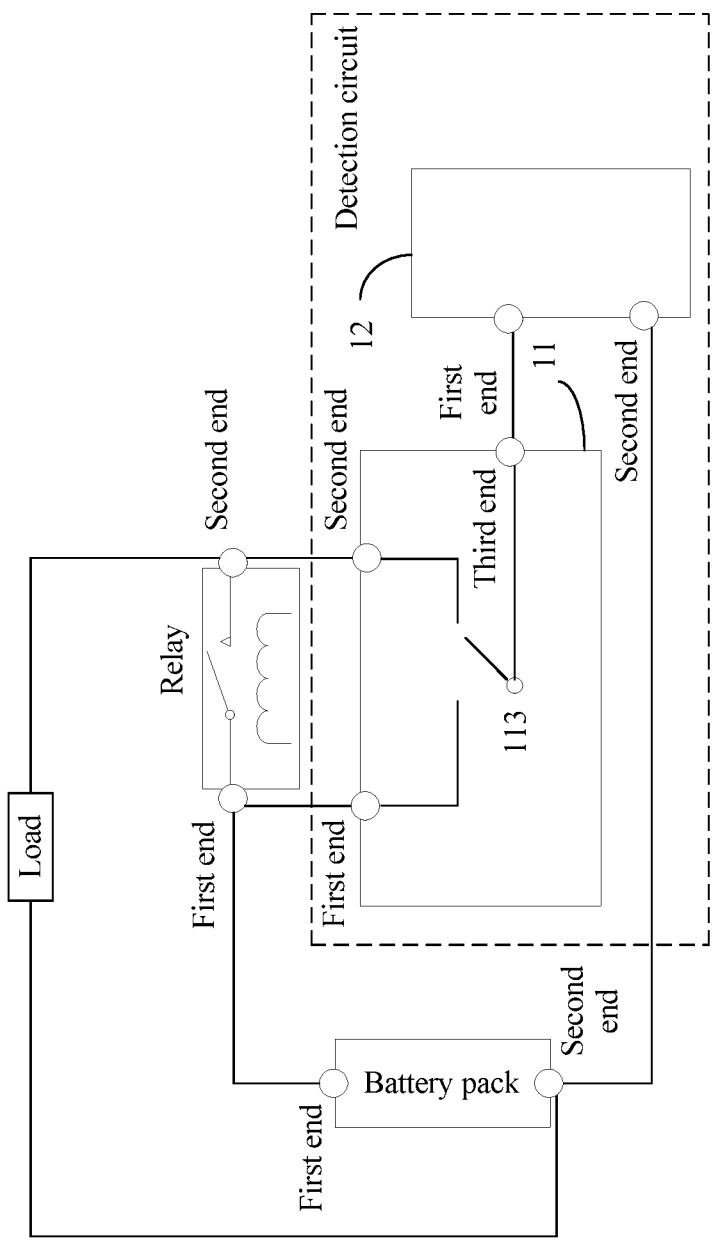
FIG. 4 is a schematic diagram of another detection circuit according to this application.

In the manner 2, as shown in FIG. 4, the switch conversion unit 11 includes a third switch 113. FIG. 4 is drawn based on FIG. 2. The third switch 113 includes a first end, a second end, and a third end, and the third end of the third switch 113 is the third end of the switch conversion unit 11.

The third switch 113 may be a controllable switch, for example, may include but is not limited to a single-pole double-throw switch, a semiconductor switch, and an optical coupling switch. The third switch 113 is configured to conduct the first end of the third switch 113 and the third end of the third switch 113 within the first duration, so that the first end of the third switch 113 serves as the first end of the switch conversion unit 11, even if the first end of the switch conversion unit 11 is connected to the third end of the switch conversion unit 11. In this way, the collection control unit 12 collects the voltage V1. The third switch 113 is configured to conduct the second end of the third switch 113 and the third end of the third switch 113 within the second duration, so that the third end of the third switch 113 servers as the third end of the switch conversion unit 11, even if the second end of the switch conversion unit 11 is connected to the third end of the switch conversion unit 11. In this way, the collection control unit 12 collects the voltage V2.

Figure 5:
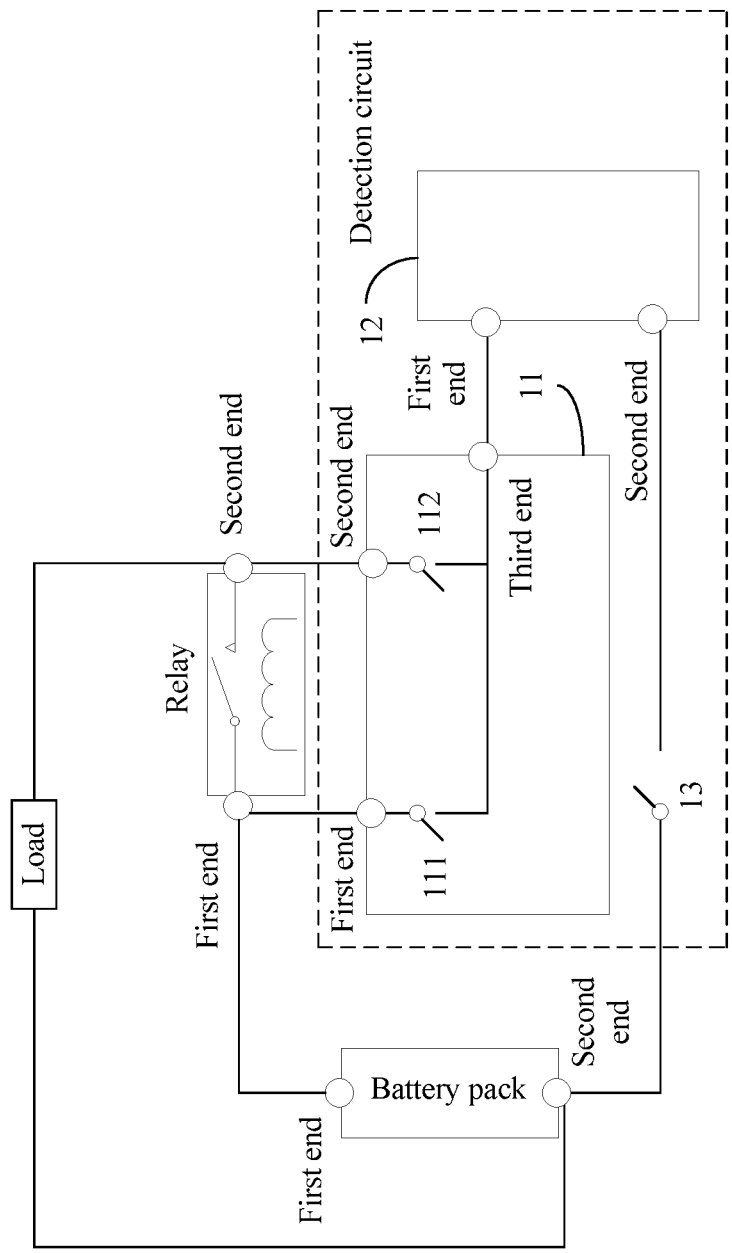
FIG. 5 is a schematic diagram of another detection circuit according to this application.
Figure 6:
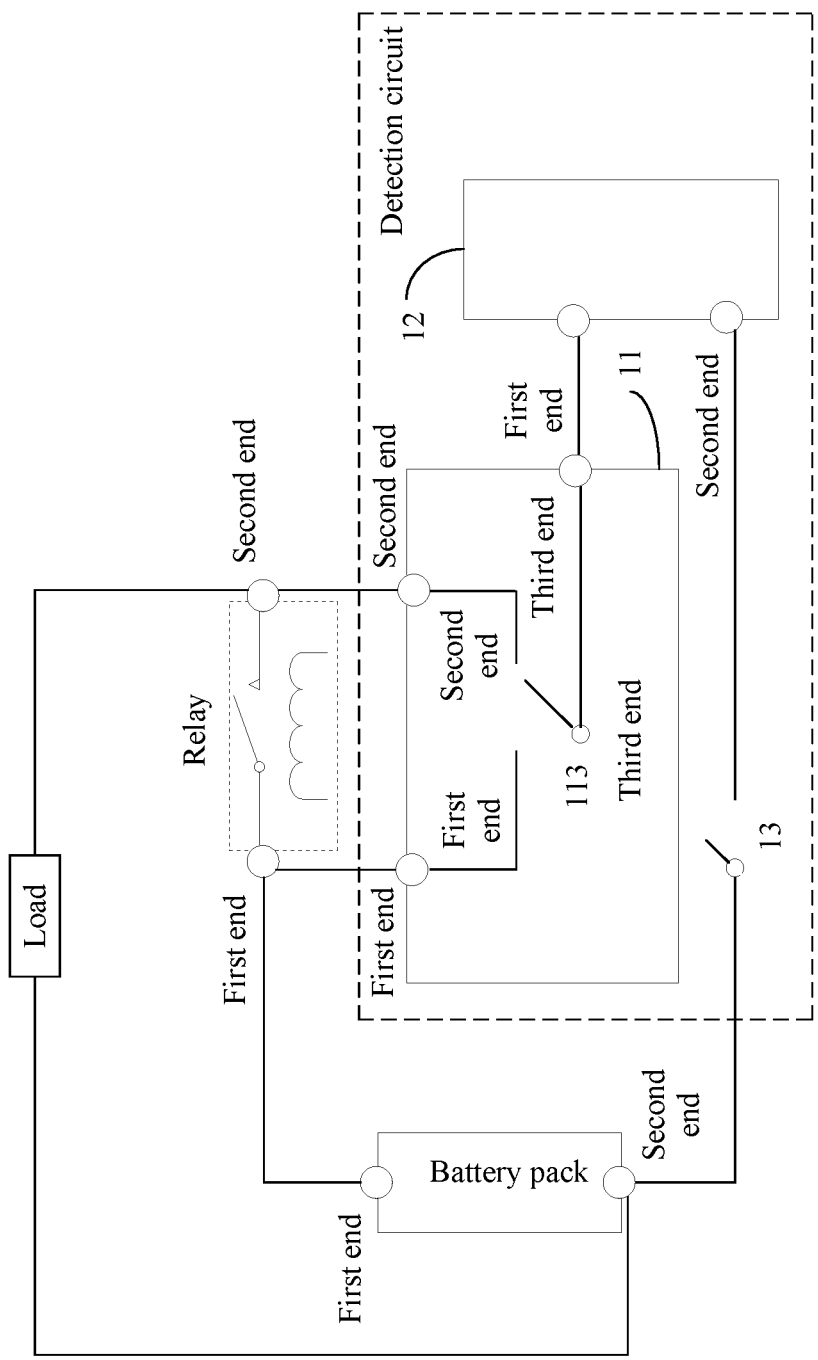
FIG. 6 is a schematic diagram of another detection circuit according to this application.

In an embodiment of this application, the detection circuit may further include a fourth switch 13, and the fourth switch 13 is disposed between the second end of the battery pack and the second end of the collection control unit 12. Based on FIG. 3, a detection circuit may be shown in FIG. 5. Based on FIG. 4, a detection circuit may be shown in FIG. 6. In this way, conduction and disconnection of a circuit between the battery pack and the collection control unit 12 can be controlled. As shown in FIG. 5 or FIG. 6, the fourth switch 13 and the switch conversion unit 11 may be separately disposed. In addition, the fourth switch 13 may alternatively be integrated into the switch conversion unit 11. In this case, two ports may be added to the switch conversion unit 11, and the fourth switch 13 is disposed between the two ports.

Figure 7:
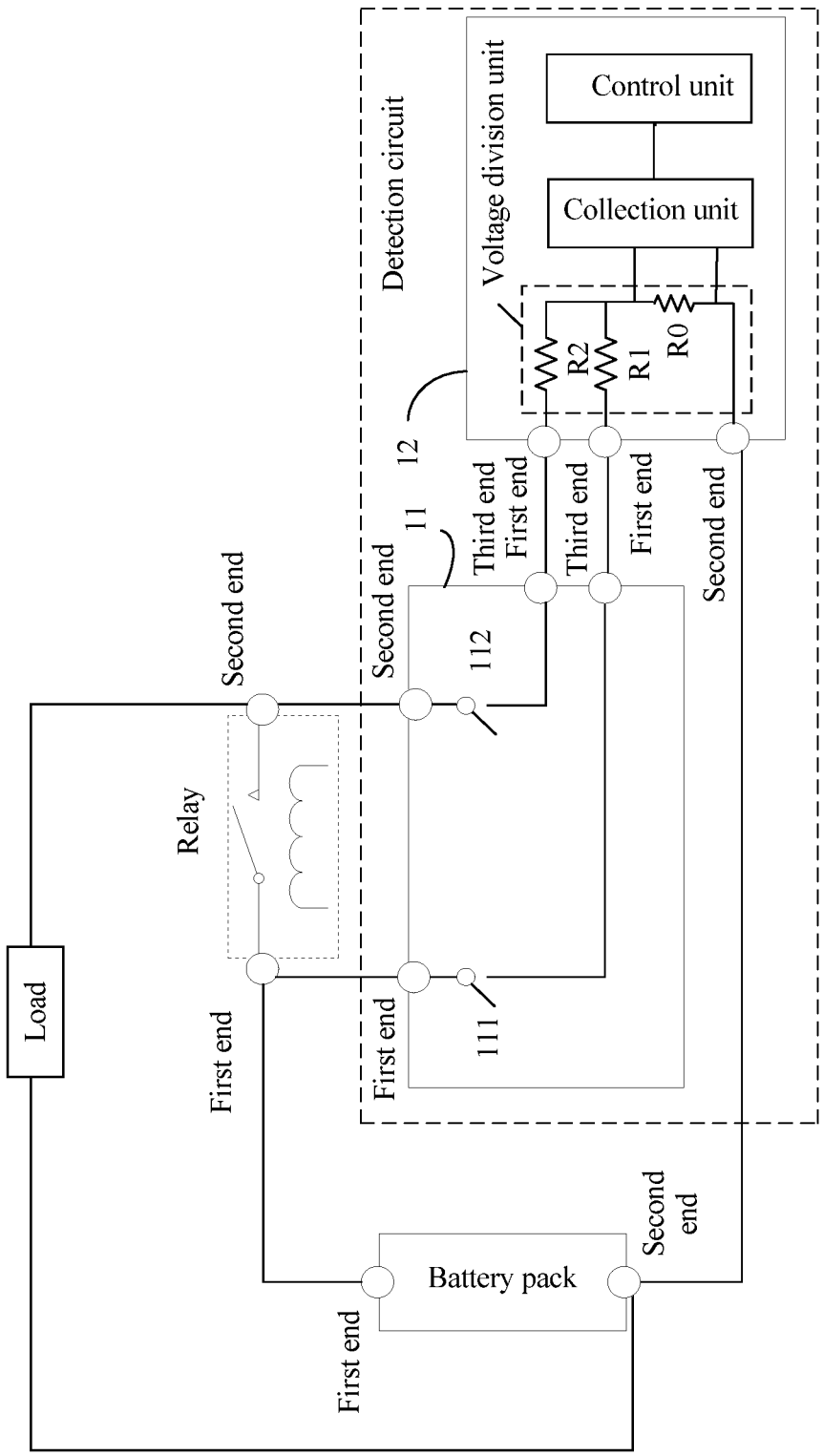
FIG. 7 is a schematic diagram of another detection circuit according to this application.

In an embodiment of this application, a voltage between the two ends of the battery pack is very high. Therefore, a voltage division unit is disposed, so that the collection control unit 12 can indirectly collect the voltage between the two ends of the battery pack (namely, the voltage V1 between the first end of the relay and the second end of the battery pack). In this case, as shown in FIG. 7, the collection control unit 12 may include a voltage division unit, a collection unit, and a control unit. FIG. 7 is drawn based on FIG. 3. It may be understood that in FIG. 7, the switch conversion unit 11 may include two third ends, and correspondingly, the collection control unit 12 includes two first ends, and the voltage division unit may include resistors R0, R1, and R2. In the detection circuit shown in FIG. 7, when the first switch 111 is closed, the collection control unit 12 collects a voltage V0 between two ends of the resistor R0, and calculates V1, where V1=V0 (R1+R0)/R0. When the second switch 112 is closed, the collection control unit 12 collects a voltage V0' between the two ends of the resistor R0, and calculates V2, where V2=V0' (R2+R0)/R0.

Figure 8:
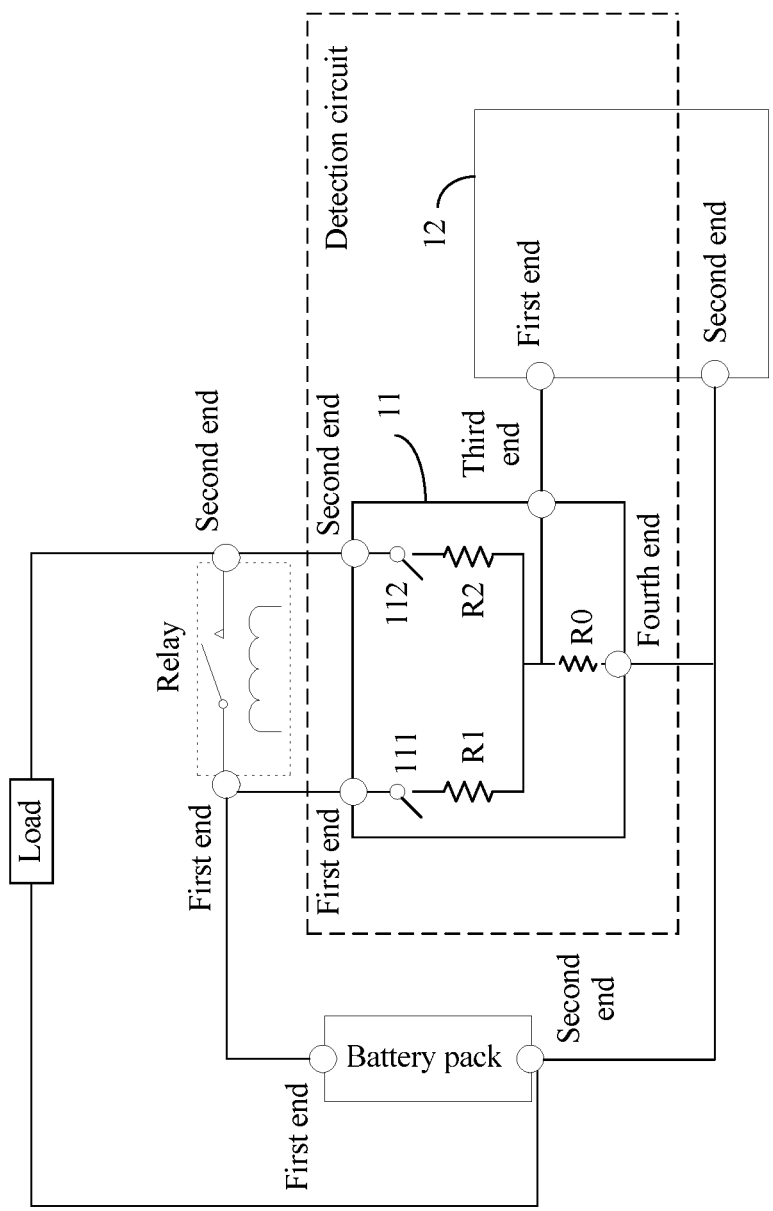
FIG. 8 is a schematic diagram of another detection circuit according to this application.

It may be understood that during specific implementation, FIG. 7 may be equivalent to FIG. 8, in other words, the voltage division unit is integrated into the switch conversion unit 11. In FIG. 8, the switch conversion unit 11 may further include a fourth end, and the fourth end is connected to the second end of the collection control unit 12. A part of the voltage division unit is connected to the first switch 111 and the fourth end, and the other part of the voltage division unit is connected to the second switch 112 and the fourth end.

Figure 9:
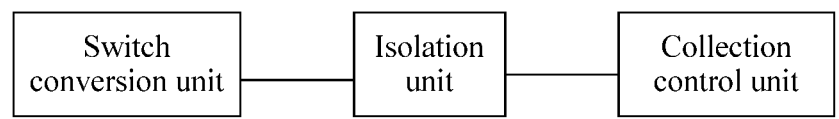
FIG. 9 is a schematic diagram of a position at which an isolation unit is disposed according to this application.

In an embodiment of this application, an isolation unit may be disposed to isolate the battery management system from a high-voltage power battery system to ensure safety of the high-voltage power battery system when the relay is faulty. The isolation unit may include an isolator. FIG. 9 is a schematic diagram of a position at which an isolation unit is disposed. The isolation unit may be disposed between the switch conversion unit 11 and the collection control unit 12.

How to detect whether a relay is faulty is used as an example for description in the foregoing description. If the battery management system includes two relays, the first end of the battery pack is connected to a first end of a second relay, a second end of the second relay is connected to one end of the load, the other end of the load is connected to a second end of a first relay, and a first end of the first relay is connected to the second end of the battery pack, the two detection circuits provided above may be used to detect whether the two relays are faulty. In addition, as shown in FIG. 10, the two detection circuits may be further integrated together.

Figure 10:
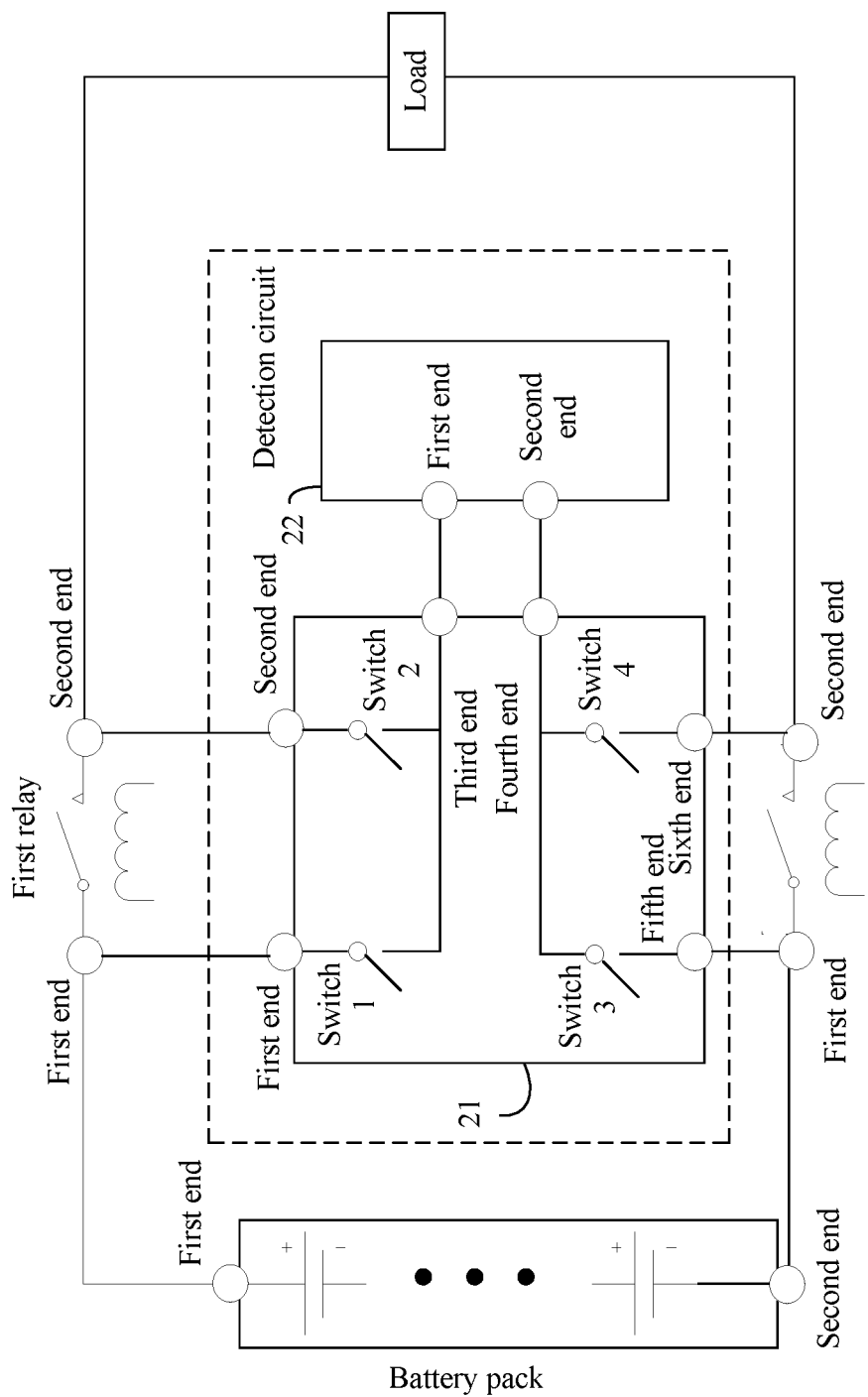
FIG. 10 is a schematic diagram of another detection circuit according to this application.

FIG. 10 is drawn based on FIG. 3. In FIG. 10, "the first relay is a positive output relay and the second relay is a negative output relay" is used as an example for description. It may be understood that a meaning of a "fourth end" in FIG. 10 is different from a meaning of the "fourth end" in FIG. 7.

As shown in FIG. 10, a detection circuit includes a switch conversion unit 11 and a collection control unit 12. A battery pack, the first relay, and the second relay each include a first end and a second end. The switch conversion unit 11 includes a first end, a second end, a third end, a fourth end, a fifth end, and a sixth end. The collection control unit 12 includes a first end and a second end. The first end of the switch conversion unit 11 is connected to the first end of the first relay, and the second end of the switch conversion unit 11 is connected to the second end of the first relay. The third end of the switch conversion unit 11 is connected to the first end of the collection control unit 12, and the fourth end of the switch conversion unit 11 is connected to the second end of the collection control unit 12. The fifth end of the switch conversion unit 11 is connected to the first end of the second relay, and the sixth end of the switch conversion unit 11 is connected to the second end of the second relay. The switch conversion unit 11 includes a switch 1, a switch 2, a switch 3, and a switch 4. The switch 1 is disposed between the first end of the switch conversion unit 11 and the third end of the switch conversion unit 11, the switch 2 is disposed between the second end of the switch conversion unit 11 and the third end of the switch conversion unit 11, the switch 3 is disposed between the fourth end of the switch conversion unit 11 and the fifth end of the switch conversion unit 11, and the switch 4 is disposed between the fourth end of the switch conversion unit 11 and the sixth end of the switch conversion unit 11.

In the detection circuit shown in FIG. 10, detecting whether the first relay is faulty may include the following.

The switch 1 is closed within duration 1, so that the first end of the collection control unit 12 is connected to the first end of the first relay. The switch 3 is closed within the duration 1, so that the second end of the collection control unit 12 is connected to the second end of the battery pack. In this case, the collection control unit 12 collects a voltage V1 between the first end of the first relay and the second end of the battery pack within the duration 1.

The switch 2 is closed within duration 2, so that the first end of the collection control unit 12 is connected to the second end of the first relay, and the switch 3 is closed within the duration 2, so that the second end of the collection control unit 12 is connected to the second end of the battery pack. In this way, the collection control unit 12 collects a voltage V2 between the second end of the first relay and the second end of the battery pack within the duration 2.

Then, it is detected, based on V1 and V2, whether the first relay is faulty. For a specific implementation, refer to the foregoing description.

In the detection circuit shown in FIG. 10, detecting whether the second relay is faulty may include the following.

The switch 1 is closed within duration 3, so that the first end of the collection control unit 12 is connected to the first end of the battery pack, and the switch 3 is closed within the duration 1, so that the second end of the collection control unit 12 is connected to the second end of the battery pack. In this way, the collection control unit 12 collects a voltage V3 between the first end of the second relay and the first end of the battery pack within the duration 3.

The switch 1 is closed within duration 4, so that the first end of the collection control unit 12 is connected to the first end of the battery pack, and the switch 4 is closed within the duration 1, so that the second end of the collection control unit 12 is connected to the first end of the battery pack. In this way, the collection control unit 12 collects a voltage V4 between the second end of the second relay and the first end of the battery pack within the duration 4.

Then, it is detected, based on V3 and V4, whether the second relay is faulty. For a specific implementation, refer to the foregoing description.

It may be understood that in this example, the first relay may be detected before the second relay. Alternatively, the second relay may be detected before the first relay. In addition, because V1 and V3 are equal, only one thereof needs to be obtained during specific implementation.

The following uses a specific example for description.

Figure 11:
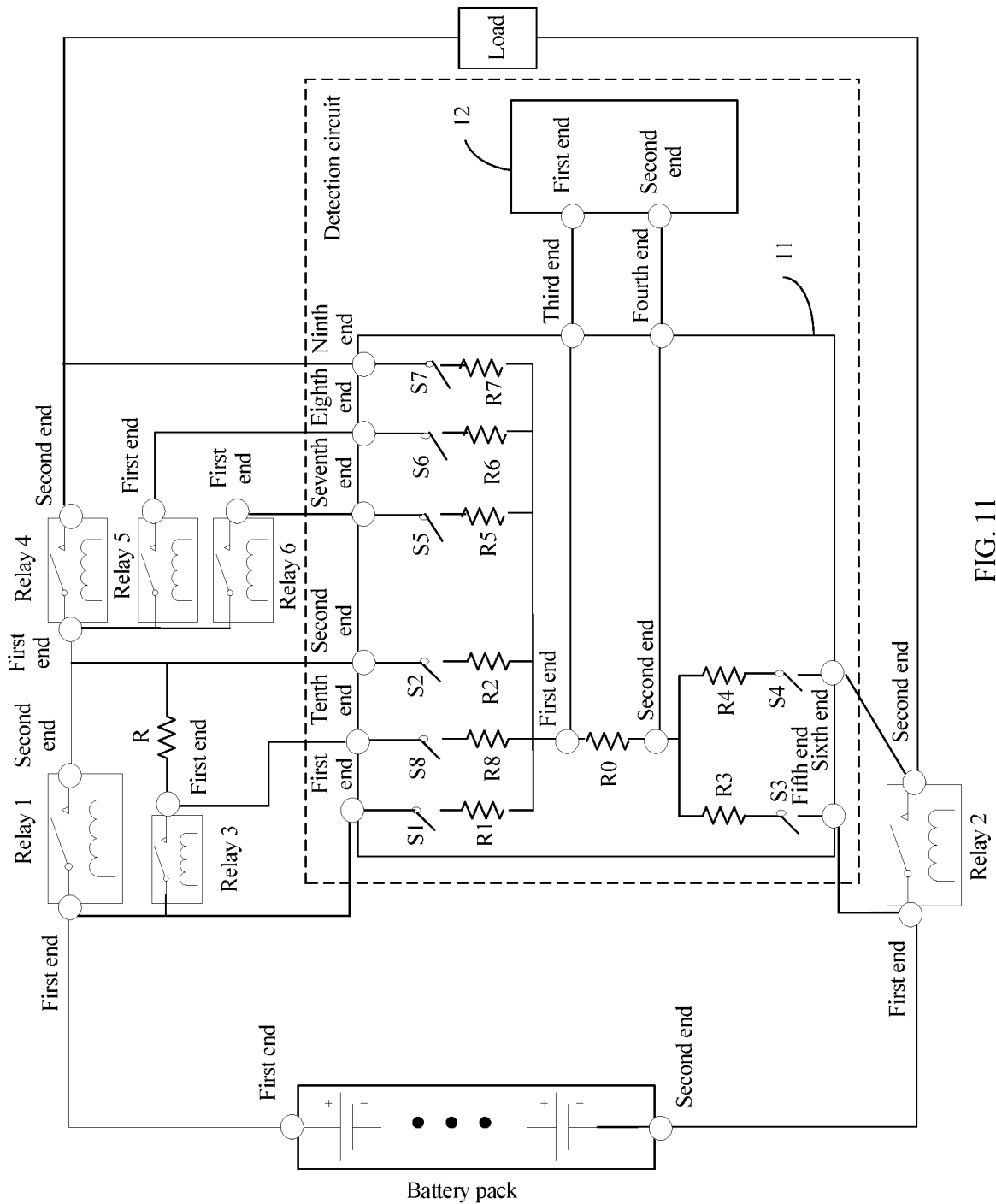
FIG. 11 is a schematic diagram of another detection circuit according to this application.

FIG. 11 shows a detection circuit according to this application. FIG. 11 is drawn based on FIG. 8 and FIG. 10. A battery management system shown in FIG. 11 may include a battery pack, a relay 1, a relay 2, a relay 3, a relay 4, a relay 5, a relay 6, and a load. A first end of the battery pack is connected to a first end of the relay 1, a second end of the relay 1 is connected to a first end of the relay 4, a second end of the relay 4 is connected to one end of the load, the other end of the load is connected to a second end of the relay 2, and a first end of the relay 2 is connected to a second end of the battery pack. The relay 3 and a pre-charge resistor R form a series branch circuit, and the relay 3 and the relay 1 form a parallel branch circuit. The relay 6 is connected to the relay 5 in parallel, and is connected to the relay 4 in parallel.

The detection circuit shown in FIG. 11 includes a switch conversion unit 11 and a collection control unit 12. A first end of the switch conversion unit 11 is connected to the first end of the relay 1, a second end of the switch conversion unit 11 is connected to the second end of the relay 1, a third end of the switch conversion unit 11 is connected to a first end of the collection control unit 12, a fourth end of the switch conversion unit 11 is connected to a second end of the collection control unit 12, a fifth end of the switch conversion unit 11 is connected to the first end of the relay 2, a sixth end of the switch conversion unit 11 is connected to the second end of the relay 2, a seventh end of the switch conversion unit 11 is connected to a first end of the relay 6, an eighth end of the switch conversion unit 11 is connected to a first end of the relay 5, a ninth end of the switch conversion unit 11 is connected to the second end of the relay 4, and a tenth end of the switch conversion unit 11 is connected to a first end of the relay 3. A switch S1 and a resistor R1 are sequentially disposed between the first end of the switch conversion unit 11 and the first end of the collection control unit 12. A switch S2 and a resistor R2 are sequentially disposed between the second end of the switch conversion unit 11 and the first end of the collection control unit 12. A switch S5 and a resistor R5 are sequentially disposed between the seventh end of the switch conversion unit 11 and the first end of the collection control unit 12. A switch S6 and a resistor R6 are sequentially disposed between the eighth end of the switch conversion unit 11 and the first end of the collection control unit 12. A switch S7 and a resistor R7 are sequentially disposed between the ninth end of the switch conversion unit 11 and the first end of the collection control unit 12. A switch S8 and a resistor R8 are sequentially disposed between the tenth end of the switch conversion unit 11 and the first end of the collection control unit 12. A switch S3 and a resistor R3 are sequentially disposed between the fifth end of the switch conversion unit 11 and the second end of the collection control unit 12. A switch S4 and a resistor R4 are sequentially disposed between the sixth end of the switch conversion unit 11 and the second end of the collection control unit 12. A first end of a detection resistor R0 is connected to the third end of the switch conversion unit 11, and a second end of the detection resistor R0 is connected to the fourth end of the switch conversion unit. In addition, the first end of the detection resistor R0 is connected to R1, R2, R5, R6, R7, and R8, and the second end of the detection resistor R0 is connected to R3 and R4.

For detecting whether the relay 1 is faulty, refer to related content about detecting the first relay in FIG. 10. For detecting whether the relay 2 is faulty, refer to related content about detecting the second relay in FIG. 10.

When it is detected whether the relay 3 is faulty, the switch conversion unit 11 may be configured to close the switches S1 and S3 within duration 5, and close the switches S3 and S8 within duration 6. The collection control unit 12 is configured to collect a voltage V13 within the duration 5, collect a voltage V38 within the duration 6, and determine, based on V13 and V38, whether the relay 3 is faulty.

When it is detected whether the relay 4 is faulty, the switch conversion unit 11 may be configured to close the switches S2 and S3 within duration 7, and close the switches S7 and S3 within duration 8. The collection control unit 12 is configured to collect a voltage V23 within the duration 7, collect a voltage V37 within duration 8, and determine, based on V23 and V37, whether the relay 4 is faulty.

For related content about detecting whether the relay 5 is faulty and detecting whether the relay 6 is faulty, refer to the foregoing related content about detecting whether the relay 4 is faulty.

A sequence of detecting the relay 1 and the relay 2 is not limited in this application. A sequence of detecting the relay 3, the relay 4, the relay 5, and the relay 6 is not limited, either. During specific implementation, at least one of the relay 3, the relay 4, the relay 5, and the relay 6 may be detected.

It should be noted that this example is described using "detecting, in a power-on process, whether a relay is faulty" as an example. In the technical solution provided in this application, it may be detected, in a power-on process, whether the relay is faulty, or it may be detected, when the relay normally works, whether the relay is faulty.

Figure 12:
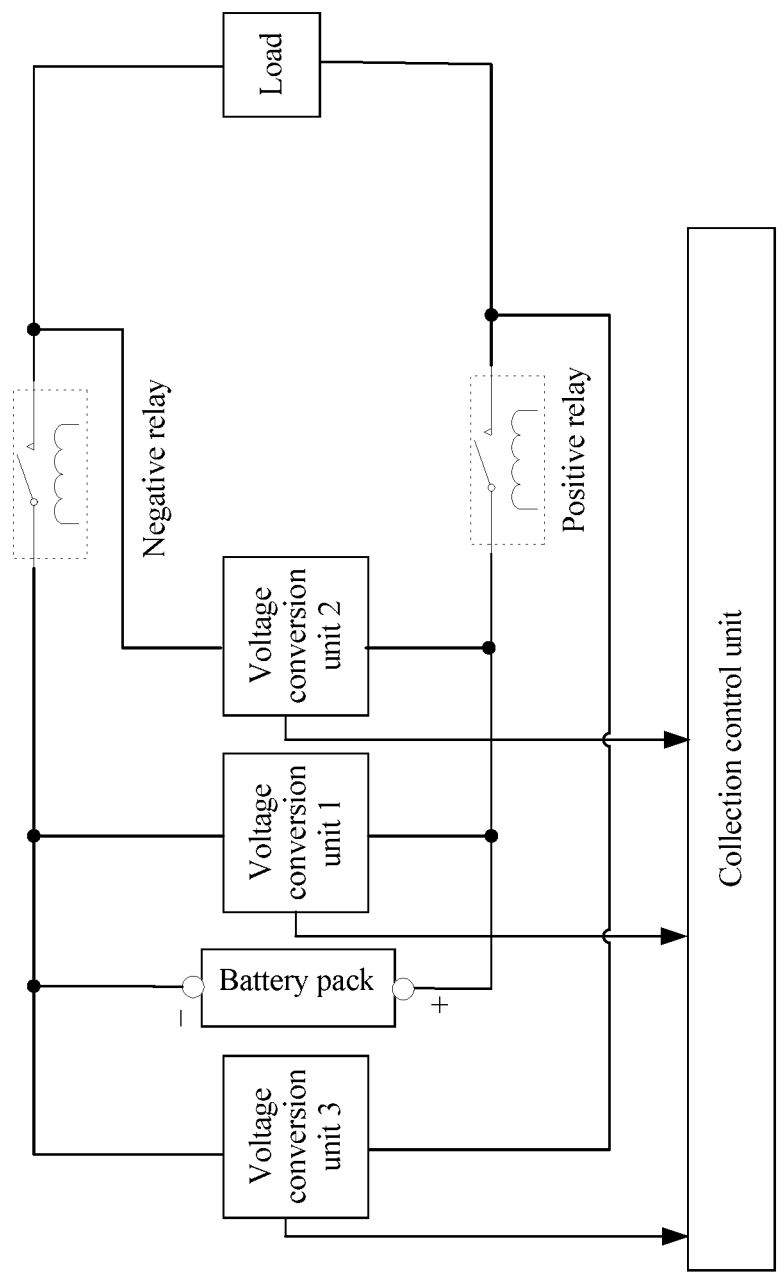
FIG. 12 is a schematic diagram of another detection circuit according to this application.
Figure 13:
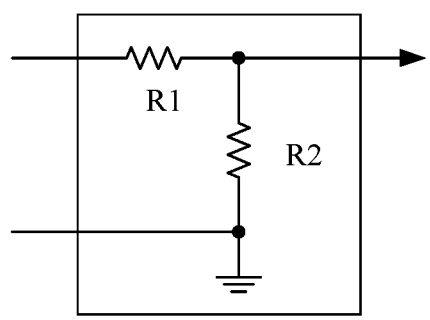
FIG. 13 is a schematic diagram of a voltage conversion unit according to this application.
Figure 14:
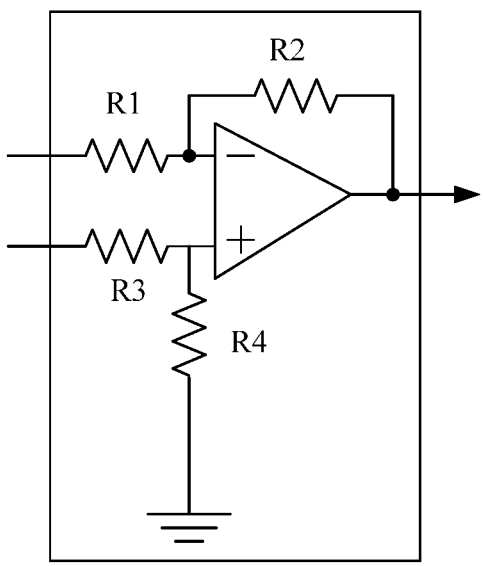
FIG. 14 is a schematic diagram of another voltage conversion unit according to this application.

FIG. 12 shows another detection circuit according to this application. The detection circuit may be applied to a battery management system. The battery management system may include a battery pack, a load, a positive output relay, and a negative output relay. The detection circuit may include a voltage conversion unit 1, a voltage conversion unit 2, a voltage conversion unit 3, and a collection control unit. The voltage conversion unit 1 is configured to measure a voltage between two ends of the battery pack (namely, V1 or V3 in the example shown in FIG. 10). The voltage conversion unit 2 is configured to measure a voltage between a positive electrode of the negative output relay and a positive electrode of the battery pack (namely, V4 in the example shown in FIG. 10). The voltage conversion unit 3 is configured to measure a voltage between a negative electrode of the positive output relay and a negative electrode of the battery pack (namely, V2 in the example shown in FIG. 10). The voltage conversion units are all connected to the collection control unit. Based on this example, for a method for determining whether the positive output relay and the negative output relay are faulty, refer to the foregoing description. It may be understood that in this example, it may be simultaneously or successively detected whether the positive output relay and the negative output relay are faulty. Optionally, the voltage conversion units may be shown in FIG. 13 or FIG. 14.

This application further provides a detection method. The method may be applied to any detection circuit provided above. For example, when the method is applied to the detection circuit shown in FIG. 2, the method may include the following steps. First, a voltage V1 between a first end of a relay and a second end of a battery pack is collected within first duration. Then, a voltage V2 between a second end of the relay and the second end of the battery pack is collected within second duration. Finally, it is determined, based on V1 and V2, whether the relay is faulty. In an embodiment, a state of the relay is determined based on an absolute value of a difference between V1 and V2, and if it is determined that the state of the relay is different from a preset state, it is determined that the relay is faulty. The state of the relay includes one of a closed state and an open state, and the preset state includes one of a closed state and an open state. For related content about determining the state of the relay, refer to the foregoing description.

It is determined, based on a collected load voltage, whether the negative output relay and the pre-charge relay are normal, and when both the negative output relay and the pre-charge relay are normal, it is detected whether a positive output relay is faulty, in the technical solution provided in this application, it can be independently detected whether the relay is faulty to improve safety and reliability of a high-voltage power battery system.

The methods or algorithm steps described with reference to the content disclosed in this application may be implemented in a hardware manner, or may be implemented in a manner of executing a software instruction by a processing module. The software instruction may include a corresponding software module. The software module may be stored in a RAM, a flash memory, a ROM, an erasable programmable read-only memory (EPROM), an electrically erasable programmable read-only memory (EEPROM), a register, a hard disk, a removable hard disk, a compact disc read-only memory (CD-ROM), or a storage medium in any other forms well-known in the art. A storage medium used as an example is coupled to the processor, so that the processor can read information from the storage medium, and can write information into the storage medium. Certainly, the storage medium may be a component of the processor. The processor and the storage medium may be located in an ASIC.

A person of skill in the art should be aware that in one or more of the foregoing examples, the functions described in this application may be implemented using hardware, software, firmware, or any combination thereof. When this application is implemented by software, these functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general-purpose or dedicated computer.

What is claimed is:

1. A detection circuit applied to a battery management system, wherein the detection circuit comprises:
    a switch conversion circuit comprising:
        a first end of the switch conversion circuit coupled to a first end of a relay, wherein the battery management system comprises the relay, a battery pack, and a load, wherein a first end of the battery pack is coupled to the first end of the relay;
        a second end of the switch conversion circuit coupled to a second end of the relay, wherein the second end of the relay is also coupled to a first end of the load, wherein a second end of the load is coupled to a second end of the battery pack;
        a third end of the switch conversion circuit;
        a fourth end of the switch conversion circuit;
        a resistor R0, wherein a first end of the resistor R0 is connected to the third end of the switch conversion unit and a second end of the resistor R0 is connected to the fourth end of the switch conversion circuit;
        a first switch and a resistor R1, wherein the first switch and the resistor R1 are sequentially disposed between the first end of the switch conversion circuit and the third end of the switch conversion circuit; and
        a second switch and a resistor R2, wherein the second switch and the resistor R2 are sequentially disposed between the second end of the switch conversion circuit and the third end of the switch conversion circuit;
    and
    a collection control circuit comprising:
        a first end coupled to the third end of the switch conversion circuit; and
        a second end coupled to the fourth end of the switch conversion circuit.

2. The detection circuit according to claim 1, wherein the first switch is configured to close during a first duration and open during a second duration; and wherein the second switch is configured to close during the second duration and open during the first duration.

3. The detection circuit according to claim 1, wherein the relay comprises at least one of a positive output relay, a pre-charge relay, or a negative output relay.

4. The detection circuit according to claim 2, wherein the detection control circuit is configured to:
    collect a voltage V0 between the two ends of the resistor R0 when the first switch is closed; and
    collect a voltage V0' between the two ends of the resistor R0 when the second switch is closed.

5. The detection circuit according to claim 4, wherein the detection control circuit is configured to:
    calculate a voltage V1, wherein V1=V0(R1+R0)/R0;
    calculate a voltage V2, wherein V2=V0' (R2+R0)/R0; and
    determine whether the relay is faulty based on the voltage V1 and the voltage V2.

6. The detection circuit according to claim 5, wherein the collection control circuit comprises a processor configured to:
    determine a state of the relay based on an absolute value of a difference between the voltage V1 and the voltage V2; and
    determine that the relay is faulty in response to determining that the state of the relay is different from a preset state, wherein the state of the relay comprises a closed state or an open state, and wherein the preset state comprises a closed state or an open state.

7. A detection method applied to a battery management system comprising a battery pack, a relay, and a load, wherein the detection method comprises:
    collecting, by a collection control circuit of a detection circuit comprising a switch conversion circuit and coupled to the battery management system, a voltage V0 between two ends of a resistor R0 when a first switch is closed,
    wherein a first end of the relay is coupled to a first end of the battery pack, wherein a second end of the relay is coupled to a first end of the load, wherein a second end of the load is coupled to a second end of the battery pack,
    wherein a first end of the switch conversion circuit is coupled to the first end of the relay, wherein a second end of the switch conversion circuit is coupled to the second end of the relay, wherein a third end of the switch conversion circuit is coupled to a first end of the resistor R0, and wherein a fourth end of the switch conversion circuit is coupled to a second end of the resistor R0, wherein the first switch and a resistor R1 are sequentially disposed between the first end of the switch conversion circuit and the third end of the switch conversion circuit, and wherein a first end of the collection control circuit is coupled to the third end of the switch conversion circuit, wherein a second end of the collection control circuit is coupled to the fourth end of the switch conversion circuit;

collecting, by the collection control circuit, a voltage V0' between the first end and the second end of the resistor R0 when a second switch is closed, wherein the second switch and a resistor R2 are sequentially disposed between the second end of the switch conversion circuit and the third end of the switch conversion circuit; and determining, by the collection control circuit whether the relay is faulty based on the voltage V0 and the voltage V0'.

8. The detection method according to claim 7, further comprising:
enabling, by the switch conversion circuit of the detection circuit, the first end of the switch conversion circuit to connect to the third end of the switch conversion circuit during the first duration; and
enabling, by the switch conversion circuit, the second end of the switch conversion circuit to connect to the third end of the switch conversion circuit during a second duration.

9. The detection method according to claim 7, wherein the collection control circuit comprises a voltmeter, and wherein the voltage V0 and the voltage V0' are collected using the voltmeter.

10. The detection method according to claim 7, wherein the collection control circuit comprises a processor, and wherein determining whether the relay is faulty is performed by the processor.

11. The detection method according to claim 7, wherein determining whether the relay is faulty based on the voltage V0 and the voltage V0' comprises:
calculate a voltage V1, wherein V1=V0(R1+R0)/R0;
calculate a voltage V2, wherein V2=V0' (R2+R0)/R0; and
determine whether the relay is faulty based on the voltage V1 and the voltage V2.

12. The detection method according to claim 11, wherein determining whether the relay is faulty based on the voltage V1 and the voltage V2 comprises:
determining a state of the relay based on an absolute value of a difference between the voltage V1 and the voltage V2, wherein the state of the relay comprises a closed state or an open state; and
determining that the relay is faulty in response to determining that the state of the relay is different from a preset state, wherein the preset state comprises a closed state or an open state.

13. The detection method according to claim 11, further comprising:
calculating, by the collection control circuit, an absolute value of a difference between the voltage V1 and the voltage V2; and
determining that a state of the relay is in a closed state in response to determining that the absolute value of the difference between the voltage V1 and the voltage V2 is less than or equal to a preset threshold.

14. The detection method according to claim 11, further comprising:
calculating, by the collection control circuit, an absolute value of a difference between the voltage V1 and the voltage V2; and
determining that a state of the relay is in an open state in response to determining that the absolute value of the difference between the voltage V1 and the voltage V2 is greater than a preset threshold.

15. A battery management system, comprising:
a battery pack comprising:
a first end of the battery pack; and
a second end of the battery pack;
a relay comprising:
a first end of the relay coupled to the first end of the battery pack; and
a second end of the relay;
a load comprising:
a first end of the load coupled to the second end of the relay; and
a second end of the load coupled to the second end of the battery pack; and
a detection circuit, comprising:
a switch conversion circuit comprising:
a first end of the switch conversion circuit coupled to the first end of the relay;
a second end of the switch conversion circuit coupled to the second end of the relay; and
a third end of the switch conversion circuit;
a fourth end of the switch conversion circuit;
a resistor R0, wherein a first end of the resistor R0 is connected to the third end of the switch conversion unit and a second end of the resistor R0 is connected to the fourth end of the switch conversion circuit;
a first switch and a resistor R1, wherein the first switch and the resistor R1 are sequentially disposed between the first end of the switch conversion circuit and the third end of the switch conversion circuit; and
a second switch and a resistor R2, wherein the second switch and the resistor R2 are sequentially disposed between the second end of the switch conversion circuit and the third end of the switch conversion circuit; and
a collection control circuit comprising:
a first end of the collection control circuit coupled to the third end of the switch conversion circuit; and
a second end of We collection control circuit coupled to the fourth end of the switch conversion circuit.

16. The battery management system according to claim 15,
wherein the first switch is configured to close during a first duration and open during a second duration; and
wherein the second switch is configured to close during the second duration and open during the first duration.

17. The battery management system according to claim 16, wherein the detection control circuit is configured to:
collect a voltage V0 between the two ends of the resistor R0 when the first switch is closed; and
collect a voltage V0' between the two ends of the resistor R0 when the second switch is closed.

18. The battery management system according to claim 17, wherein the detection control circuit is further configured to:

calculate a voltage V1, wherein V1=V0(R1+R0)/R0;
calculate a voltage V2, wherein V2=V0' (R2+R0)/R0; and
determine whether the relay is faulty based on the voltage V1 and the voltage V2.

19. The battery management system according to claim 18, wherein the collection control circuit comprises a processor configured to:
determine a state of the relay based on an absolute value of a difference between the voltage V1 and the voltage V2; and
determine that the relay is faulty in response to determining that the state of the relay is different from a preset state, wherein the state of the relay comprises a closed state or an open state, and wherein the preset state comprises a closed state or an open state.

20. The battery management system according to claim 15, wherein the relay comprises at least one of a positive output relay, a pre-charge relay, or a negative output relay.

* * * * *